US006605407B2

(12) United States Patent
Yu et al.

(10) Patent No.: US 6,605,407 B2
(45) Date of Patent: Aug. 12, 2003

(54) THERMALLY CONVERTIBLE LITHOGRAPHIC PRINTING PRECURSOR

(75) Inventors: Yisong Yu, Vancouver (CA); Jonathan William Goodin, Tsawwassen (CA); John Emans, Burnaby (CA); Keith Christall, Vancouver (CA)

(73) Assignee: Creo Inc., Burnaby (CA)

( * ) Notice: Subject to any disclaimer, the term of this patent is extended or adjusted under 35 U.S.C. 154(b) by 198 days.

(21) Appl. No.: 09/745,548

(22) Filed: Dec. 26, 2000

(65) Prior Publication Data

US 2002/0081519 A1 Jun. 27, 2002

(51) Int. Cl.[7] .......... G03F 7/038

(52) U.S. Cl. .......... 430/270.1; 430/944; 430/178; 430/302

(58) Field of Search .......... 430/178, 300, 430/302, 270.1, 944

(56) References Cited

U.S. PATENT DOCUMENTS

| | | | | | |
|---|---|---|---|---|---|
| 3,476,937 | A | | 11/1969 | Vrancken | |
| 3,679,410 | A | | 7/1972 | Vrancken et al. | |
| 3,793,025 | A | | 2/1974 | Vrancken et al. | |
| 3,971,660 | A | | 7/1976 | Staehle | |
| 4,004,924 | A | | 1/1977 | Vrancken et al. | |
| 4,258,122 | A | * | 3/1981 | Uchida et al. | 430/253 |
| 4,284,705 | A | | 8/1981 | Phlipot et al. | |
| 4,731,317 | A | | 3/1988 | Fromson et al. | |
| 5,339,737 | A | | 8/1994 | Lewis et al. | |
| 5,378,580 | A | * | 1/1995 | Leenders | 430/303 |
| 5,713,287 | A | | 2/1998 | Gelbart | |
| 5,816,162 | A | | 10/1998 | Vermeersch | |
| 5,849,464 | A | * | 12/1998 | Yokoya et al. | 430/303 |
| 5,858,606 | A | * | 1/1999 | Meisters et al. | 430/200 |
| 5,888,696 | A | * | 3/1999 | Hirano et al. | 430/272.1 |
| 6,000,794 | A | * | 12/1999 | Kondo et al. | 347/105 |
| 6,001,536 | A | | 12/1999 | Vermeersch et al. | |
| 6,004,728 | A | * | 12/1999 | Deroover et al. | 430/302 |
| 6,022,668 | A | * | 2/2000 | Burberry et al. | 430/302 |
| 6,030,750 | A | | 2/2000 | Vermeersch et al. | |
| 6,083,663 | A | * | 7/2000 | Vermeersch et al. | 430/302 |
| 6,096,471 | A | * | 8/2000 | Van Damme et al. | 430/188 |
| 6,096,481 | A | | 8/2000 | Vermeersch et al. | |
| 6,110,644 | A | | 8/2000 | Vermeersch et al. | |
| 6,207,349 | B1 | * | 3/2001 | Lewis | 430/302 |
| 6,251,563 | B1 | * | 6/2001 | Van Damme et al. | 430/302 |
| 6,300,032 | B1 | * | 10/2001 | Van Damme et al. | 430/188 |
| 6,329,121 | B2 | * | 12/2001 | Obayashi et al. | 430/270.1 |
| 6,379,863 | B1 | * | 4/2002 | Oohashi et al. | 430/270.1 |

FOREIGN PATENT DOCUMENTS

| | | | |
|---|---|---|---|
| EP | 601240 | A1 | 6/1994 |
| EP | 619524 | A1 | 10/1994 |
| EP | 619525 | A1 | 10/1994 |
| EP | 0802457 | A1 | 10/1997 |
| EP | 619525 | B1 | 3/1999 |
| EP | 601240 | B1 | 4/1999 |
| EP | 619524 | B1 | 8/1999 |
| FR | 2300354 | | 9/1996 |
| GB | 1419512 | | 12/1975 |

OTHER PUBLICATIONS

Research Disclosure, Jan. 1992, 33303, pp. 2–3, "A lithographic printing plate", J. Vermeersch.

* cited by examiner

*Primary Examiner*—Janet Baxter
*Assistant Examiner*—Amanda C. Walke
(74) *Attorney, Agent, or Firm*—Oyen Wiggs Green & Mutala

(57) ABSTRACT

In accordance with the present invention there is provided an imaging element for lithographic offset printing. The imaging element comprises hydrophobic polymer particles in an aqueous medium, a substance for converting light into heat and an inorganic salt. The imaging element may be used for printing long run lengths on lower quality paper and in the presence of set-off powder. The imaging element may be imaged and developed on-press and may be sprayed onto a hydrophilic surface to create a printing surface that may be processed wholly on-press. The hydrophilic surface may be a printing plate substrate or the printing cylinder of a printing press or a seamless sleeve around the printing cylinder of a printing press. This cylinder may be conventional or seamless.

20 Claims, No Drawings

THERMALLY CONVERTIBLE LITHOGRAPHIC PRINTING PRECURSOR

CROSS-REFERENCE TO RELATED APPLICATION

This application is related to our co-pending U.S. patent application entitled "Method for obtaining a lithographic printing surface," Ser. No. 09/745,520, filed Dec. 26, 2000.

FIELD OF THE INVENTION

The invention pertains to the field of lithography and in particular to imaging materials for digital-on-press technology

BACKGROUND OF THE INVENTION

At present, virtually all commercially printed copy is produced through the use of three basic types of printing. One type is a relief plate that prints from a raised surface. Another type is gravure that prints from a depressed surface. The third, namely lithographic printing is planographic and is based on the immiscibility of oil and water wherein the oily material or ink is preferentially retained in the image area of a printing plate and the water or fountain solution retained by the non-image area. A widely used type of lithographic printing plate has a light sensitive coating applied to a hydrophilic base support, typically made from anodized aluminum. The coating may respond to the light by having the portion that is exposed becoming soluble so that it may be removed by a subsequent development process. Such a plate is said to be positive working. Conversely, when the area that is exposed remains after development and the unexposed areas are removed instead, the plate is referred to as a negative working plate.

In the production of the bulk of standard commercial lithographic printing plates of this nature, a hydrophilic support is coated with a thin layer of a negative-working photosensitive composition. Typical coatings for this purpose include light-sensitive polymer layers containing diazo compounds, dichromate-sensitized hydrophilic colloids, and a large variety of synthetic photopolymers. Diazo-sensitized systems in particular are widely used.

Imagewise exposure of such imagable light-sensitive layers renders the exposed image insoluble while the unexposed areas remain soluble in a developer liquid. The plate is then developed with a suitable developer liquid to remove the imagable layer in the unexposed areas.

A particular disadvantage of photosensitive imaging elements such as those described above for making a printing plate, is that they work with visible light and have to be shielded from normal room lighting. Furthermore, they can have the problem of instability upon storage.

One approach that has been extensively followed in recent times is to laser ablate either a hydrophobic or hydrophilic coating layer to reveal a surface of the opposite character. An example is provided by Lewis et al in U.S. Pat. No. 5,339,737. This process, while simple, has the drawback of generating ablative debris and dust. This dust and debris may accumulate on sensitive optical components of the system and affect performance. It may also find its way onto the printing surface and generate unwanted artifacts on the printed copies.

Methods have been known since the 1960's for making printing plates involving the use of imaging elements that utilize heat-driven processes rather than direct photosensitivity. This allows processing without the need for photographic darkrooms and makes possible the concept of on-press processing. In view of this benefit, as well as the limitations of direct photosensitive plates described above, the trend towards these heat-based printing plate precursors is to be anticipated and is, in fact, reflected in the market.

In 1964 Vrancken in U.S. Pat. No. 3,476,937 described a basic heat mode printing plate or thermal printing plate precursor in which particles of thermoplastic polymer in a hydrophilic binder coalesce under the influence of heat, or heat and pressure, that is image-wise applied. The fluid permeability of the material in the exposed areas is significantly reduced. This approach forms the basis of heat-based lithographic plates that are developed using various aqueous media. In the later U.S. Pat. No. 3,793,025 Vrancken describes the addition of a pigment or dye for converting visible light to heat, after which essentially the same process is followed as in the earlier disclosure. In U.S. Pat. No. 3,670,410 interlayer structures based on the same principles are presented. In U.S. Pat. No. 4,004,924 Vrancken describes the use of hydrophobic thermoplastic polymer particles in a hydrophilic binder together with a material to convert visible light to heat. This combination is employed to generate printing masters specifically by flash exposure.

This early work of Vrancken has formed the basis of commercial lithographic products. However, this work did not address the inherent problems associated with the use of lithographic plates sensitive to visible wavelengths of light under the practical conditions of commercial printing. This early work was performed at a time when digital-on-press technology had not yet been developed. The patents therefore did not anticipate many of the considerations typical of this newer technology wherein data is written point for point directly to the imaging surface by a point light source or combination of such sources such as laser arrays, and the imaging surface is developed on-press.

There is a fundamental principle to take note of in comparing photographic and thermal media. In the case of photographic media the image is produced by a photochemical effect and the imaging process is driven directly by the light-sensitivity of the photosensitive material. In the case of thermal media, the coagulation or coalescence of the hydrophobic polymer particles is a process driven by heat. These media, in typical formulations available at this time, therefore also contain an element that converts electromagnetic radiation to heat. The choice of this converter material determines the range of electromagnetic wavelengths to which the media will respond.

Recently the use of infra-red wavelengths of light generated either by YAG lasers or, more recently, 800–900 nm radiation from high power Group III–V laser diodes and diode arrays has increased radically. By employing these infrared wavelengths of light, the need for dark room handling of undeveloped plates is obviated as described earlier. The choice of infrared wavelengths of light, however, is not to be confused with the fact that this light also has to be converted to heat in order to drive the thermal process that leads to the coalescence of polymer particles. The terms "thermal plates" or "heat mode plates" therefore refer to the conversion mechanism by which the hydrophilicity of the surface of the plate is changed, and does not refer to the wavelength of the light being employed. Products that function on the basis of this principle are today on the market. One example is the Thermolite product from the company Agfa of Mortsel in Belgium.

Since the basic offset printing process requires fountain solution to wet the printing surface before inking, much effort has been put into ensuring that on-press media may be developed using the same fountain solution or at least an aqueous liquid. There is, however, a trade-off between durability of the imaged printing surface and its developability. If the surface is easily developed, it is often not very durable. This durability limitation is thought to be due to the abrasive action of the pigments employed in offset inks coupled with the physical interaction between the blanket cylinder and the plate master cylinder that results in relatively rapid wear of the oleophilic image areas of the printing plate.

As pointed out by Vermeersch in U.S. Pat. No. 6,001,536, these newer technological issues were addressed to some degree by Research Disclosure No. 33303 of January 1992. This document discloses a heat-sensitive imaging element comprising, on a support, a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink accepting without any further development. A disadvantage of this method is that the printing plate so obtained is easily damaged since the non-printing areas may become ink-accepting when some pressure is applied thereto. Moreover, under critical conditions, the lithographic performance of such a printing plate may be poor and accordingly such printing plate has little lithographic printing latitude.

Subsequent development of the technology along the above lines has produced a considerable body of art largely teaching various single- and multi-layered structures based on hydrophobic polymer particles in a hydrophilic binder combined, either in the same layer or separate layers, with a material to convert light to heat. A variety of individual polymers, light-to-heat-converters and hydrophilic binders have been proposed. Examples of these media and some aspects of their on-press imaging and processing are provided by Vermeersch in the family of patents U.S. Pat. Nos. 6,001,536, 6,030,750, 6,096,481 and 6,110,644. Vermeersch provides in U.S. Pat. No. 5,816,162 an example of a multilayer structure that may be imaged and processed on-press. Fundamentally, these developments have all been improvements on the basic approach set out by Vrancken in U.S. Pat Nos. 3,476,937 and 4,004,924.

These developments all have one factor in common. The printing surfaces produced by these materials provide run-lengths (number of printing impressions per plate) of the order of 20,000 to 30,000 impressions per prepared printing surface on good quality paper. This is rather shorter than the run-lengths achievable with some other kinds of media used in industry. This cause of this may be traced directly to the developability versus durability trade-off raised earlier. The commercially available thermal media also does not function well with lower quality uncoated paper or in the presence of some commonly used press-room chemicals such as set-off powder, reducing the run-length often to less than one third of that achieved under ideal conditions. This is unfortunate in that these materials and lower quality paper are both inherent realities of the commercial printing industry.

The literature reveals a variety of alternate approaches. Examples include coatings comprising core-shell particles, softenable particles or various functional layers. These alternative approaches also suffer from endurance problems during printing and/or from reduced ink uptake. In particular, it has been disclosed by Fromson in U.S. Pat. No. 4,731,317, based on an alternative body of work, that non-film-forming polymer emulsions such as LYTRON 614, which is a styrene based polymer with a particle size on the order of 1000 Angstroms, can be used, alone or with an energy absorbing material such as carbon black, to form an image according to that particular invention. In the embodiment of that invention, the polymer emulsion coating is not light sensitive but the substrate used therein converts laser radiation so as to fuse the polymer particles in the image area. In other words, the glass transition temperature (Tg) of the polymer is exceeded in the imaged areas thereby fusing the image in place onto the substrate. The background can be removed using a suitable developer to remove the non-laser illuminated portions of the coating. Since the fused polymer is ink loving, a laser imaged plate results without using a light sensitive coating such as diazo. However, there is a propensity for the background area to retain a thin layer of coating in such formulations. This results in toning of the background areas during printing.

Operations involving off-press imaging and manual mounting of printing plates are relatively slow and cumbersome. On the other hand, high speed information processing technologies are in place today in the form of pre-press composition systems that can electronically handle all the data required for directly generating the images to be printed. Almost all large scale printing operations currently utilize electronic pre-press composition systems that provide the capability for direct digital proofing, using video displays and visible hard copies produced from digital data, text and digital color separation signals stored in computer memory. These pre-press composition systems can also be used to express page-composed images to be printed in terms of rasterized, digitized signals. Consequently, conventional imaging systems in which the printing images are generated off-press on a printing plate that must subsequently be mounted on a printing cylinder present inefficient and expensive bottle-necks in printing operations.

On-press imaging is a newer method of generating the required image directly on the plate or printing cylinder. Existing on-press imaging systems can be divided into two types.

In the first type a blank plate is mounted on the press and imaged once, thus requiring a new plate for each image. An example of this technology is the well-known Heidelberg Model GTO-DI, manufactured by the Heidelberg Druckmaschinen AG (Germany). This technology is described in detail by Lewis in U.S. Pat. No. 5,339,737. The major advantage compared to off-press plate making is much better registration between printing units when printing color images.

With press imaging systems that use plates, whether imaged off-press or on-press, the mounting cylinder is split so that clamping of the ends of the plate can be effected by a clamping means that passes through a gap in the cylinder and a slit between the juxtaposed ends of the plate. The gap in the mounting cylinder causes the cylinder to become susceptible to deformation and vibration. The vibration causes noise and wears out the bearings. The gap in the ends of the plate also leads to paper waste in some situations.

To address these issues of wear and paper waste, there has been much focus on creating a second type of on-press imaging system that will allow the coating of the very printing cylinder itself, or a sleeve around it, with an appropriate thermal medium working by the principles outlined above. An example of this approach is given by Gelbart in U.S. Pat. No. 5,713,287, which also describes the spraying of media onto the printing surface while the printing surface is mounted on the press.

In the case of both types of on-press imaging systems the overall process has the same elements. The printing surface, whether plate or cylinder or sleeve, is cleaned. It is then coated with the thermal medium. The coating is then cured or dried to form a hydrophilic layer or one that can be removed by fountain or other aqueous solutions. This layer is then imaged using data written directly, typically via a laser or laser array. This coalesces the polymeric particles in the imaged areas, making the imaged areas hydrophobic or resistant to removal. The printing surface is then developed using an appropriate developer liquid. This includes the possibility of using fountain solution. The coating in the unexposed areas is thereby removed, leaving the imaged hydrophobic areas. The printing surface is then inked and the ink adheres only to the hydrophobic imaged and coalesced areas, but not to the exposed areas of the hydrophilic substrate where there is water from the fountain solution, thereby keeping the ink, which is typically oil-based, from adhering. Printing is now performed. At the end of the cycle, the imaged layer is removed by a solvent and the process is restarted.

It is clear that, at the time of this application for letters patent, the needs of industry have not yet been adequately met in the field of thermal lithographic media. There remains a real need for a thermal lithographic medium that can produce extended run lengths and function effectively in the presence of press-room chemicals. It should also function effectively on lower quality paper and be compatible with the rapidly developing on-press technologies, including the more recent spray-on technologies.

It is the intention with this application for letters patent to address this need.

BRIEF SUMMARY OF THE INVENTION

In accordance with the present invention there is provided a printing master for lithographic offset printing. The printing master comprises hydrophobic polymer particles in an aqueous medium, a substance for converting light into heat, and an inorganic salt. The printing master may be used for printing long run lengths on lower quality paper and in the presence of press-room chemicals. The imaging element can be imaged and developed on-press and it can also be sprayed onto a hydrophilic surface to create a printing surface that may be processed wholly on-press. It can also be processed in the more conventional fully off-press fashion. The hydrophilic surface can be a printing plate substrate or the printing cylinder of a printing press or a sleeve around the printing cylinder of a printing press. This cylinder can be conventional or seamless.

No drawings are associated with this application for letters patent

DETAILED DESCRIPTION OF THE PREFERRED EMBODIMENT

The present invention is embodied in a thermally convertible lithographic printing precursor comprising a lithographic base with an imagable coating on those of its surfaces that are to be used for printing. The imagable medium of the imagable coating comprises uncoalesced particles of one or more hydrophobic thermoplastic polymers, one or more converter substances capable of converting radiation into heat and one or more inorganic salts. The individual components may be applied to the lithographic as a single coating or in different combinations in separate layers.

As will be demonstrated at the hand of thirteen examples, it has been discovered that the combination of components described above produces a medium which, when coated onto the lithographic base and exposed imagewise to light of wavelength appropriate to the incorporated converter substance, is developable in aqueous media including fountain solution to create a lithographic printing surface.

As will be demonstrated, when the medium is prepared without one of the key components, namely the inorganic salt, it exhibits no developability, the entire coating resisting washing off in aqueous media. The inorganic salt therefore plays a key role as a development enhancing agent.

In this application for letters patent the term lithographic printing precursor is used to describe any printing plate, printing cylinder or printing cylinder sleeve, or any other surface bearing a coating of imageable material that may be either converted or removed imagewise to create a surface that may be inked selectively and used for lithographic printing. The phrase lithographic printing surface is used in this application for letters patent to describe the selectively inkable surface so created.

The specific term lithographic base is used here to describe the base onto which the imageable material is coated. The lithographic bases used in accordance with the present invention are preferably formed of aluminum, zinc, steel, or copper. These include the known bi-metal and tri-metal plates such as aluminum plates having a copper or chromium layer; copper plates having a chromium layer and steel plates having copper or chromium layers. Other preferred substrates include metallized plastic sheets such as poly(ethylene terephthalate).

Particularly preferred plates are grained, or grained and anodized, aluminum plates where the surface is roughened (grained) mechanically or chemically (e.g. electrochemically) or by a combination of roughening treatments. The anodizing treatment can be performed in an aqueous acid electrolytic solution such as sulphuric acid or a combination of acids such as sulphuric and phosphoric acid.

According to the present invention, the anodized aluminum surface of the lithographic base may be treated to improve the hydrophilic properties of its surface. For example, a phosphate solution that may also contain an inorganic fluoride is applied to the surface of the anodized layer. The aluminum oxide layer may be also treated with sodium silicate solution at an elevated temperature, e.g. 90° C. Alternatively, the aluminum oxide surface may be rinsed with a citric acid or citrate solution at room temperature or at slightly elevated temperatures of about 30 to 50° C. A further treatment can be made by rinsing the aluminum oxide surface with a bicarbonate solution.

Another useful treatment to the aluminum oxide surface is with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is evident that these post treatments may be carried out singly or as a combination of several treatments.

According to another embodiment in connection with the present invention, the lithographic base having a hydrophilic surface comprises a flexible support, such as e.g. paper or plastic film, provided with a cross-linked hydrophilic layer. A suitable cross-linked hydrophilic layer may be obtained from a hydrophilic (co)polymer cured with a cross-linking agent such as a hydrolysed tetra-alkylorthosilicate, formaldehyde, glyoxal or polyisocyanate. Particularly preferred is the hydrolysed tetra-alkylorthosilicate.

The hydrophilic (co-) polymers that may be used comprise for example, homopolymers and copolymers of vinyl alcohol, hydroxyethyl acrylate, hydroxyethyl methacrylate, acrylic acid, methacrylic acid, acrylamide, methylol acrylamide or methylol methacrylamide. The hydrophilicity of the (co)polymer or (co)polymer mixture used is preferably higher than that of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic (co-) polymer, more preferably between 1.0 parts by weight and 3 parts by weight.

A cross-linked hydrophilic layer of the lithographic base preferably also contains materials that increase the porosity and/or the mechanical strength of this layer. Colloidal silica employed for this purpose may be in the form of any commercially available water-dispersion of colloidal silica having an average particle size up to 40 nm. Additionally inert particles of a size larger than colloidal silica may be used e.g. alumina or titanium dioxide particles or particles having an average diameter of at least 100 nm but less than 1 $\mu$m which are particles of other heavy metal oxides. The incorporation of these particles causes a roughness, which acts as storage places for water in background areas.

The thickness of a cross-linked hydrophilic layer of a lithographic base in accordance with this embodiment can vary between 0.5 to 20 $\mu$m and is preferably 1 to 10 $\mu$m. Particular examples of suitable cross-linked hydrophilic layers for use in accordance with the present invention are disclosed in EP 601240, GB-P-1419512, FR-P-2300354, U.S. Pat. Nos. 3,971,660, and 4,284,705.

A particularly preferred substrate to use is a polyester film on which an adhesion-promoting layer has been added. Suitable adhesion promoting layers for use in accordance with the present invention comprise a hydrophilic (co-) polymer and colloidal silica as disclosed in EP 619524, and EP 619525. Preferably, the amount of silica in the adhesion-promoting layer is between 0.2 and 0.7 mg per $m^2$. Further, the ratio of silica to hydrophilic binder is preferably more than 1 and the surface area of the colloidal silica is preferably at least 300 $m^2$ per gram.

In this application for letters patent the term uncoalesced is used to describe a state of an assemblage of polymer particles that are not substantially fused together. This is to be contrasted with coalesced polymer particles where a plurality of particles has essentially fused together to form a contiguous whole.

The hydrophobic thermoplastic polymer particles used in connection with the present invention preferably have a coalescence temperature above 35° C. and more preferably above 50° C. The coalescence of the polymer particles may result from softening or melting of the thermoplastic polymer particles under the influence of heat. The specific upper limit to the coalescence temperature of the thermoplastic hydrophobic polymer should be below the decomposition temperature of the thermoplastic polymer. Preferably the coalescence temperature is at least 10° C. below the decomposition temperature of the polymer particle. When the polymer particles are subjected to a temperature above their coalescence temperature they become an amorphous hydrophobic agglomerate so that the hydrophobic particles cannot be removed by water or an aqueous liquid.

Specific examples of hydrophobic thermoplastic polymer particles for use in connection with the present invention with a Tg above 40° C. are preferably polyvinyl chloride, polyethylene, polyvinylidene chloride, polyacrylonitrile, poly(meth)acrylates etc., copolymers or mixtures thereof. More preferably used are polymethyl-methacrylate or copolymers thereof. Polystyrene itself or polymers of substituted styrene are particularly preferred, most particularly polystyrene copolymers or polyacrylates. The weight average molecular weight of the hydrophobic thermoplastic polymer in the dispersion may range from 5,000 to 1,000,000 g/mol.

The hydrophobic thermoplastic polymer in the dispersion may have a particle size from 0.01 $\mu$m to 30 $\mu$m, more preferably between 0.01 $\mu$m and 3 $\mu$m and most preferably between 0.02 $\mu$m and 0.25 $\mu$m. The hydrophobic thermoplastic polymer particle is present in the liquid of the imagable coating.

A suitable method for preparing an aqueous dispersion of the thermoplastic polymer comprises the following steps:

(a) dissolving the hydrophobic thermoplastic polymer in an organic water immiscible solvent with a boiling point less than 100C, (b) dispersing the solution in water or an aqueous medium and (c) evaporating the organic solvent to remove it.

Alternatively it can be prepared by the methods disclosed in U.S. Pat. No. 3,476,937.

The amount of hydrophobic thermoplastic polymer dispersion contained in the image forming layer is preferably between 20% by weight and 95% by weight and more preferably between 40% by weight and 90% by weight and most preferably between 50% by weight and 85% by weight.

In a preferred embodiment, the imagable coating may be applied to the lithographic base while the latter resides on the press. The lithographic base may be an integral part of the press or it may be removably mounted on the press. In this embodiment the imagable coating may be cured by means of a curing unit integral with the press, as described by Gelbart in U.S. Pat. No. 5,713,287.

Alternatively, the imagable coating may be applied to the lithographic base and cured before the complete thermally convertible lithographic printing precursor is loaded on the printing cylinder of a printing press. This situation would pertain in a case where a lithographic printing plate is made separate from the press or a press cylinder is provided with a lithographic printing surface without being mounted on the press.

The term curing is here to be understood to include the hardening of the imagable medium, specifically including the drying thereof, either with or without cross-linking of the incorporated polymer.

Before applying the imagable coating to the lithographic base, the lithographic base may be treated to enhance the developability or adhesion of the imagable coating. In the preferred embodiment of the invention, the imageable material of the coating is imagewise converted by means of the spatially corresponding imagewise generation of heat within the coating to form an area of coalesced hydrophobic polymer particles.

The imaging process itself may be by means of scanned laser radiation as described by Gelbart in U.S. Pat. No. 5,713,287. The wavelength of the laser light and the absorption range of the converter substance are chosen to match each other. This process may be conducted off-press, as on a plate-setting machine, or on-press, as in digital-on-press technology.

The heat to drive the process of coalescence of the polymer particles is produced by the converter substance, herewith defined as a substance that has the property of converting radiation into heat. Within this wider definition, the specific term thermally convertible lithographic printing precursor is used to describe the particular subset of lithographic printing precursors in which the imageable material of the coating is imagewise converted by means of the spatially corresponding imagewise generation of heat to form an area of coalesced hydrophobic polymer particles. This area of coalesced hydrophobic polymer particles will therefore be the area to which lithographic printing ink will adhere for the purposes of subsequent printing.

Where the imagewise exposure is to be performed by lasers, it is desirable that the converter substances present in the composition have high absorbance at the wavelength of the laser. Such substances are disclosed in JOEM Handbook 2 Absorption Spectra of Dyes for Diode Lasers, Matsuoka, Ken, bunshin Shuppan, 1990 and Chapter 2, 2.3 of Development and Market Trend of Functional Colouring Materials in 1990's, CMC Editorial Department, CMC, 1990, such as polymethine type colouring material, a phthalocyanine type colouring material, a dithiol metallic complex salt type colouring material, an anthraquinone type colouring material, a triphenylmethane type colouring material an azo type dispersion dye, and an intermolecular CT colouring material. The representative examples include N-[4-[5-(4-dimethylamino-2-methylphenyl)-2,4-pentadienylidene]-3-methyl-2,5-cyclohexadiene-1-ylidene]-N,N-dimethylammonium acetate, N-[4-[5-(4-dimethylaminophenyl)-3-phenyl-2-pentene-4-in-1-ylidene]-2,5-cyclohexadiene-1-ylidene]-N,N-dimethylammonium perchlorate, bis(dichlorobenzene-1,2-dithiol)nickel(2:1) tetrabutylammonium and polyvinylcarbazol-2,3-dicyano-5-nitrol 1,4-naphthoquinone complex.

Carbon black, other black body absorbers and other infra red absorbing materials, dyes or pigments may also be used as the thermal converter, particularly with higher levels of infra-red absorption/conversion at 800–1100 nm and particularly between 800 and 850 nm.

Some specific commercial products that may be employed as light to heat converter substances include Pro-jet 830NP, a modified copper phthalocyanine from Avecia of Blackley, Lancashire in the U.K., and ADS 830A, an infra-red absorbing dye from American Dye Source Inc. of Montreal, Quebec, Canada.

Embodiments of the present invention provide an inorganic salt for use in the imaging element. The salts are chosen for their solubility in water, aqueous solution or press fountain solution. The concentration of salt used is sufficient to make the unexposed dispersion more permeable to water or fountain solution whilst at the same time can be extracted by the fountain solution from the coalesced areas. In operation, the non-coalesced areas (unexposed during the imaging process) are easily developed because of the presence of the inorganic salt. However, during the continuation of the print run the salt is slowly extracted out of the coalesced areas of the coating due to its solubility in fountain solution. The result is that the coalesced area becomes more hydrophobic. The leaching out of the salt enhances the long term durability of the plate throughout its run.

The function of the salt is such that it should be substantially soluble in the dispersion that is to be coated. In addition to the solubility characteristics, the salts should also be capable of facilitating the removal of the unexposed portions of the image coat by fountain solution thus enhancing the developability of the un-irradiated portion of the imaging element. Further, the salt must be capable of being extracted from the coalesced image, thus maintaining the durability of the image area during the print run and increasing the resistance of the image to wear by offset powder or other press-room chemicals.

A further enhancing feature of the incorporation of the salt is that it permits polymers to be used that have lower coalescence temperatures than could be used hitherto. This has the beneficial effect of increasing the conversion sensitivity of the system to the laser light.

The preferred concentration of such salts is between 2 and 50% w/w of the polymer particles; more preferably, between 10 and 40% w/w of the polymer particles. However, the concentration of specific salts should not be so high as to cause attack and dissolution of the anodic layer. Examples of suitable salts include but are not limited to sodium acetate, potassium carbonate, lithium acetate, sodium metasilicate etc.

The inorganic salt could in fact be a mixture of two or more salts and/or a double salt and such a mixture could perform synergistically in a more improved way than any one salt would suggest. Similarly, salts which form part of a mixture may not necessarily perform in the desired way when used alone.

The aforementioned description of the process is not intended to limit the scope of the invention but to provide an insight into the mechanism for the benefit of practitioners.

The thermally convertible lithographic printing precursor may be subsequently developed after exposure using an aqueous medium. During such development, the area of coalesced hydrophobic polymer particles will not allow water or aqueous medium to penetrate it or adhere to it, while the unexposed areas of the coating may be readily washed off using an aqueous medium such as fountain solution. Again, as described by Gelbart in U.S. Pat. No. 5,713,287, this process may be conducted on the press as part of the digital-on-press technological approach.

During subsequent inking with an oil-based lithographic ink, the exposed areas of the imagable coating will be the areas to which the lithographic printing ink will adhere. This makes possible the subsequent use of the inked surface for the purposes of printing.

While the present invention pertains very directly to the manufacture of lithographic plates, it has particular significance in the on-press-processing environment. In the case of fully on-press processing, where the imagable medium is sprayed onto a plate on the printing cylinder, or even on to the printing cylinder itself, there is a considerable list of criteria, all of which are to be met by any thermally convertible lithographic printing precursor that is to meet the needs of industry. The thermally convertible lithographic printing precursor of the present invention meets these criteria.

In the first place, the imagable medium forming part of the thermally convertible lithographic printing precursor of the present invention is of such consistency as to be sprayable. This is required for on-press application of the medium to the lithographic base.

Secondly, the imagable medium contained within the present invention is also capable of being cured without cross-linking such that the unexposed imagable medium may be removed by an aqueous medium.

The thermally convertible lithographic printing precursor of the present invention also exhibits good sensitivity to the light wavelength of interest; this being determined by the light-to-heat converting material that is added to the imagable medium. Upon being imagewise exposed to such radiation, there is good coalescence of the hydrophobic polymer particles in order to produce areas of hydrophobic polymer corresponding to the image. The illuminated and coalesced area is distinctly more hydrophobic than the lithographic base, adheres well to it, and does not wash off in aqueous media.

By contrast, the unexposed areas of the same imagable medium on the thermally convertible lithographic printing precursor, are readily washed off by aqueous media. This difference in removability between exposed and unexposed areas of the imagable medium determines the basic contrast and, therefore, the effective ness of the thermally convertible lithographic printing precursor of the present invention.

Whilst satisfying all of the above criteria, the thermally convertible lithographic printing precursor of the present invention furthermore demonstrates, upon coalescence of the hydrophobic polymer particles, durability of such scope as to withstand the rigors of practical lithographic offset printing. This is a key factor wherein existing thermally convertible lithographic media do not excel.

EXAMPLES

The following examples describe thermally convertible lithographic printing precursors made in accordance with the present invention. Examples 1, 2, and 3 describe thermally convertible lithographic printing precursors imaged on-press and developed on-press. Examples 4, 5 and 6 describe thermally convertible lithographic printing precursors imaged off-press and developed on-press. Examples 7, 8, 9 and 10 describe thermally convertible lithographic printing precursors that were imaged off-press and developed off-press. Examples 11, 12 and 13 describe thermally convertible lithographic printing precursors that were applied, imaged and processed wholly on-press. In these examples, materials were supplied as follows:

Inorganic Salts:

Sodium phosphate, sodium carbonate from Aldrich Chemicals Milwaukee, Wis., U.S.A.

Polymers:

Texigel 13-800 from Scott Bader Inc., Hudson, Ohio, U.S.A.

UCAR 471 from Union Carbide, Danbury, Conn., U.S.A.

Rhoplex WL-51 from Rohm & Haas, Philadelphia, Pa., U.S.A.

Flexbond 289 Air Products, Allentown, Pa., U.S.A.

HG-1630 is an acrylic latex from Rohm and Haas

Light-to-Heat-Converters:

Carbon black as Cabojet 200 from Cabot Inc., Billerica, Mass., U.S.A.

Pro-jet 830NP a modified copper phthalocyanine, Avecia, Blackley, Lancashire, U.K.

ADS 830A an infra-red absorbing dye from American Dye Source Inc. Montreal, Quebec, Canada.

Grained, anodized aluminum was obtained from Precision Lithoplate of South Hadley, Mass.

In order to serve as a reference and to evaluate the relative efficacy of the invention, a lithographic elelment was prepared with one of the key components intentionally omitted. 6 g Texigel 13-800, 12 g 1 wt % ADS 830A in ethanol, 44 g deionized water were mixed and the resultant emulsion was coated onto grained anodized aluminum. The coating was dried in an oven at 60C for 1 minute. When the coating was dry, a coating weight of 0.9 g/m$^2$ was obtained. The plate was imaged using a Creo Products Inc. Trendsetter laser plate setting machine with 830 nm light. The exposure was carried out with 500 mJ/cm$^2$ at 12 Watts. Following exposure the plate was washed with town water the unexposed polymer did not wash off in the non-image areas. Clearly this approach leads to a result that does not obtain a usable thermally convertible lithographic printing precursor.

In contrast with this result, the following examples serve to describe the embodiment of the invention.

Example 1

6 g UCAR 471, 12 g 5 wt % sodium carbonate in deionized water, 12 g 1 wt % ADS 830A in ethanol, 36 g deionized water were mixed and the resultant emulsion was coated onto a grained, anodized aluminum plate. The coating was dried in an oven at 60C for 1 minute. When the coating was dry a coating weight of 0.9 g/m$^2$ was obtained. The plate was mounted onto a single colour SM74 press (Heidelberg Druckmaschine, Germany) and imaged with a Creo Products Inc. digital on press laser exposure device using 830 nm light. The exposure was carried out with 500 mJ/cm$^2$ at 18 Watts. Following exposure the plate was washed with fountain solution for 20 seconds. The plate was allowed to dry and the image examined. Dampening the plate for 2 revolutions before the ink form rollers were applied started the press. 5,000 impressions were obtained when printed on uncoated recycled paper.

Example 2

6 g Texigel 13-800, 12 g 5 wt % sodium phosphate in water, 12 g 1 wt % ADS 830A in ethanol, 36 g water were mixed and the resultant emulsion was coated onto grained anodized aluminum. The coating was dried in an oven at 60C for 1 minute the resultant coating had a coating weight of 0.9 g/m$^2$. The plate was mounted onto a SM74 press (Heidelberg Druckmaschine, Germany and imaged with a Creo Products Inc. digital on press laser exposure device using 830 nm light. The exposure was carried out with 500 mJ/cm$^2$ at 18 Watts. The plate was washed with fountain solution for 30 seconds. The ink form rollers were applied and the paper fed into the press. 2,000 impressions were printed on coated paper with little deterioration in printing quality.

Example 3

6 g Rhoplex WL-51, 12 g 5 wt % sodium phosphate in water, 12 g 1 wt % carbon black dispersion in water, 36 g deionized water were mixed and the resultant emulsion was coated onto grained anodized aluminum. The coating was dried in an oven at 60C for 1 minute the resultant coating had a coating weight of 0.9 g/m$^2$. The plate was mounted onto a SM74 press (Heidelberg Druckmaschine, Germany) and imaged with a Creo Products Inc. digital on press laser exposure device using 830 nm light. The exposure was carried out with 500 mJ/cm$^2$ at 18 Watts. The plate was washed with fountain solution for 30 seconds. The ink form rollers were applied and the paper fed into the press. 2,000 impressions were printed on coated paper with little deterioration of printing quality.

Example 4

6 g UCAR 471, 12 g 5 wt % sodium carbonate in deionized water, 12 g 1 wt % ADS 830A in ethanol, 36 g deionized water were mixed and the resultant emulsion was coated onto grained anodized aluminum. The coating was dried in an oven at 60C for 1 minute. When the coating was dry a coating weight of 0.9 g/m$^2$ was obtained. The plate was imaged using a Creo Products Inc. Trendsetter laser plate setting machine with 830 nm light. The exposure was carried out with 500 mJ/$cm^2$ at 12 Watts. Following exposure the plate was mounted onto a press (Ryobi single color printing press) and washed with fountain solution for 20 seconds. The plate was allowed to dry and the image examined. Dampening the plate for 2 revolutions before the ink form rollers were applied started the press. 20,000 impressions were obtained when printed on uncoated recycled paper.

Example 5

6 g Texigel 13-800, 12 g 5 wt % sodium phosphate in water, 12 g 1 wt % ADS 830A in ethanol, 36 g water were mixed and the resultant emulsion was coated onto grained anodized aluminum. The coating was dried in an oven at 60C for 1 minute the resultant coating had a coating weight of 0.9 g/$m^2$. The plate was imaged using a Creo Products Inc. Trendsetter laser plate setting machine with 830 nm light. The exposure was carried out with 500 mJ/$cm^2$ at 12 Watts. The imaged sample was mounted onto a press (Ryobi single color printing press) and washed with fountain solution for 20 seconds. The plate was allowed to dry and the image examined. Dampening the plate for 2 revolutions before the ink form rollers were applied started the press. 2,000 impressions were printed on coated paper with little deterioration in printing quality.

Example 6

6 g Rhoplex WL-51, 12 g 5 wt % sodium phosphate in water, 12 g 1 wt % carbon black dispersion in water, 36 g deionized water were mixed and the resultant emulsion was coated onto grained anodized aluminum. The coating was dried in an oven at 60C for 1 minute the resultant coating had a coating weight of 0.9 g/$m^2$. The plate was imaged using a Creo Products Inc. Trendsetter laser plate setting machine with 830 nm light. The exposure was carried out with 500 mJ/$cm^2$ at 12 Watts. The plate was washed with water and dried in air. The imaged sample was mounted onto a press (Ryobi single color printing press) and washed with fountain solution for 20 seconds. The plate was allowed to dry and the image examined. Dampening the plate for 2 revolutions before the ink form rollers were applied started the press. 2,000 impressions were printed on coated paper with little deterioration of printing quality.

Example 7

6 g UCAR 471, 12 g 5 wt % sodium carbonate in deionized water, 12 g 1 wt % ADS 830A in ethanol, 36 g deionized water were mixed and the resultant emulsion was coated onto grained anodized aluminum. The coating was dried in an oven at 60C for 1 minute. When the coating was dry a coating weight of 0.9 g $m^2$ was obtained. The plate was imaged using a Creo Products Inc. Trendsetter laser plate setting machine with 830 nm light. The exposure was carried out with 500 mJ/$cm^2$ at 12 Watts. Following exposure the plate was washed with town water and dried in air. The imaged sample was mounted onto a press (Ryobi single color printing press) and dampened with fountain solution for 20 revolutions before the ink was applied to the plate. 20,000 impressions good quality impressions were obtained when printed on recycled paper.

Example 8

6 g UCAR 471, 12 g 5 wt % sodium phosphate in water, 12 g 1 wt % ADS 830A in ethanol, 36 g water were mixed and the resultant emulsion was coated onto grained anodized aluminum. The coating was dried in an oven at 60C for 1 minute the resultant coating had a coating weight of 0.9 g/$m^2$. The plate was imaged using a Creo Products Inc. Trendsetter laser plate setting machine with 830 nm light. The exposure was carried out with 500 mJ/$cm^2$ at 12 Watts. The plate was washed with water and dried in air. The imaged sample was mounted onto a press (Ryobi single color printing press), dampened with fountain solution for 20 revolutions before the ink was applied to the plate. 20,000 impressions were printed with an image requiring large quantities of set-off powder onto a coated paper with little deterioration in printing quality.

Example 9

6 g Rhoplex WL-51, 12 g 5 wt % sodium phosphate in water, 12 g 1 wt % carbon black dispersion in water, 36 g deionized water were mixed and the resultant emulsion was coated onto grained anodized aluminum. The coating was dried in an oven at 60C for 1 minute the resultant coating had a coating weight of 0.9 g/$m^2$. The plate was imaged using a Creo Products Inc. Trendsetter laser plate setting machine with 830 nm light. The exposure was carried out with 500 mJ/$cm^2$ at 12 Watts. The plate was washed with water and dried in air. The imaged sample was mounted onto a press (Ryobi single color printing press), dampened with fountain solution for 20 revolutions before the ink was applied to the plate. 2,000 impressions were printed on coated paper with little deterioration of printing quality.

Example 10

6 g HG-1630, 12 g 5 wt % sodium carbonate in deionized water, 12 g 1 wt % ADS 830A in ethanol, 3 g deionized water were mixed and the resultant emulsion was coated onto grained anodized aluminum. The coating was dried in an oven at 60C for 1 minute the resultant coating had a coating weight of 1.0 g/$m^2$. The plate was imaged using a Creo Products Inc. Trendsetter laser plate setting machine with 830 nm light. The exposure was carried out with 500 mJ/$cm^2$ at 12 Watts. The plate was washed with water and dried in air. The imaged sample was mounted onto a press (Ryobi single color printing press), dampened with fountain solution for 20 revolutions before the ink was applied to the plate. 1,000 impressions were printed on coated paper with little deterioration of printing quality.

Example 11

6 g Rhoplex WL-51, 12 g 5 wt % sodium carbonate in deionized water, 12 g 1 wt % ADS 830A in ethanol, 36 g deionized water were mixed to give an emulsion. An uncoated grained and anodized plate was mounted onto a Shinohara press. The emulsion was sprayed onto the plate using a high pressure low volume spray gun with 4 passes. The coating was dried with a large volume of air at 75C to give a dry coating. The coating weight of a similarly prepared sample was 1.0 g/$m^2$. The plate was imaged with a Creo Products Inc. digital on press laser exposure device using 830 nm light. The exposure was carried out with 500 mJ/$cm^2$ at 18 Watts. Following exposure the plate was washed with fountain solution for 20 seconds. The plate was allowed to dry and the image examined. Dampening the plate for 2 revolutions before the ink form rollers were applied started the press. 2,000 good quality impressions were printed on a coated paper.

Example 12

6 g Flexbond 289, 12 g 5 wt % sodium phosphate in water, 12 g 1 wt % ADS 830A in ethanol, 36 g deionized water were mixed to give an emulsion. An uncoated grained and anodized plate was mounted onto a Heidelberg SM74 press. The emulsion was sprayed onto the plate using a high-pressure low volume spray gun with 4 passes. The coating was dried with a large volume of air at 75C to give a dry coating. The coating weight of a similarly prepared sample was 0.8 g/m$^2$. The plate was imaged with a Creo Products Inc. digital on press laser exposure device using 830 nm light. The exposure was carried out with 500 mJ/cm$^2$ at 18 Watts. Following exposure the plate was washed with a commonly available fountain solution for 20 seconds. The plate was allowed to dry and the image examined. Dampening the plate for 2 revolutions before the ink form rollers were applied started the printing. Good printing quality on coated paper was obtained for the duration of the 2,000 impressions of the print-run.

Example 13

6 g UCAR 471, 12 g 5 wt % sodium phosphate in water, 12 g 1 wt % Pro-jet 830NP in water, 36 g deionized water were mixed to give an emulsion. An uncoated grained and anodized plate was mounted onto a Heidelberg SM74 press. The emulsion was sprayed onto the plate using a high-pressure low volume spray gun with 4 passes. The coating was dried with a large volume of air at 75C to give a dry coating. The coating weight of a similarly prepared sample was 0.9 g/m$^2$. The plate was imaged with a Creo Products Inc. digital on press laser exposure device using 830 nm light. The exposure was carried out with 500 mJ/cm$^2$ at 18 Watts. Following exposure the plate was washed with a commonly available fountain solution for 30 seconds. A commonly used ink was applied and the printing started. 5,000 impressions were printed on coated paper with little deterioration in the printing quality.

What is claimed is:

1. A thermally convertible lithographic printing precursor developable using an aqueous medium, said printing precursor comprising:

(a) a hydrophilic lithographic base;

(b) a radiation sensitive coating on a surface of said base, said coating comprising:

(i) uncoalesced particles of a hydrophobic thermoplastic polymer;

(ii) an inorganic salt that is substantially soluble in said aqueous medium, said salt being present in said coating in a concentration sufficient to allow the removal of said coating by said aqueous medium in areas of said coating that are not exposed to said radiation; and (iii) a converter substance capable of converting said radiation into heat.

2. A thermally convertible lithographic printing precursor as in claim 1, wherein said radiation is one of visible light and infra-red.

3. A thermally convertible lithographic printing precursor as in claim 2, wherein said radiation has a wavelength in the range of 700–1,100 nm.

4. A thermally convertible lithographic printing precursor according to claim 1, wherein said hydrophobic thermoplastic polymer is a member of at least one of the following groups of polymers: polystyrene, polymers of substituted polystyrene, polyethylene, poly(meth)acrylates, polyvinylchloride, polyurethanes, polyesters, polyacrylonitrile, and copolymers thereof.

5. A thermally convertible lithographic printing precursor according to claim 1, wherein said converter substance is at least one of carbon black, a pigment, and a dye.

6. A thermally convertible lithographic printing precursor according to claim 1, wherein said converter substance is an infrared absorbing dye.

7. A thermally convertible lithographic printing precursor according to claim 1, wherein said inorganic salt is a metal salt.

8. A thermally convertible lithographic printing precursor according to claim 1, wherein said inorganic salt is an alkali metal salt.

9. A thermally convertible lithographic printing precursor according to claim 1, wherein said hydrophilic lithographic base is one of a metallized plastic sheet, a treated aluminum plate, a sleeve-less printing press cylinder, and a printing press cylinder sleeve and a flexible support having thereon a cross-linked hydrophilic layer.

10. A thermally convertible lithographic printing precursor as in claim 9, wherein said sleeve-less printing press cylinder and said printing press cylinder sleeve are seamless.

11. A thermally convertible lithographic printing precursor as in claim 9 wherein the surface of said lithographic base is anodized aluminum.

12. A printing precursor according to claim 9 wherein said aluminum plate is grained.

13. A thermally convertible lithographic printing precursor according to claim 1, wherein said coating comprises two or more layers.

14. A printing precursor according to claim 13 wherein said converter substance is present in the same layer as said uncoalesced particles of hydrophobic thermoplastic polymer.

15. A printing precursor according to claim 1 wherein said concentration of inorganic salt is between 2–50% by weight relative to the weight of said hydrophobic thermoplastic polymer.

16. A printing precursor according to claim 1 wherein said concentration of inorganic salt is between 10–40% by weight relative to the weight of said hydrophobic thermoplastic polymer.

17. A printing precursor according to claim 1 wherein said inorganic salt is selected from the group consisting of sodium acetate, lithium acetate, potassium carbonate, sodium carbonate, sodium metasilicate and sodium phosphate.

18. A printing precursor according to claim 1 wherein the amount of said hydrophobic thermoplastic polymer in said coating is in the range of 20–95% by weight of said coating.

19. A printing precursor according to claim 1 wherein the amount of said hydrophobic thermoplastic polymer in said coating is in the range of 50–85% by weight of said coating.

20. A printing precursor according to claim 1 wherein said aqueous medium is fountain solution.

* * * * *